United States Patent [19]

Reid

[11] 4,358,175

[45] Nov. 9, 1982

[54] CONNECTOR FOR PIN TYPE INTEGRATED CIRCUIT PACKAGES

[75] Inventor: Gilbert R. Reid, Norristown, Pa.

[73] Assignee: Burroughs Corporation, Detroit, Mich.

[21] Appl. No.: 202,918

[22] Filed: Nov. 3, 1980

[51] Int. Cl.³ .......................................... H01R 23/72
[52] U.S. Cl. ............................ 339/75 M; 339/17 CF; 339/255 R
[58] Field of Search ............ 339/17 CF, 75 R, 75 M, 339/252 R, 252 S, 253 R, 253 S, 255 R, 273 R; 174/52 FP

[56] References Cited

U.S. PATENT DOCUMENTS

| | | | |
|---|---|---|---|
| 3,678,442 | 7/1972 | Cope et al. ...................... | 339/255 R |
| 3,989,331 | 11/1976 | Hanlow .......................... | 339/17 CF |
| 4,033,656 | 7/1977 | Freehauf et al. ............... | 339/17 CF |
| 4,179,171 | 12/1979 | Shannon .......................... | 339/75 M |
| 4,217,024 | 8/1980 | Aldridge et al. ............... | 339/17 CF |
| 4,293,174 | 10/1981 | Knickerbocker ............... | 339/255 R |

FOREIGN PATENT DOCUMENTS 2729179  1/1979  Fed. Rep. of Germany ... 339/255 R 1411789  10/1975  United Kingdom .......... 339/17 CF Primary Examiner—John McQuade
Attorney, Agent, or Firm—F. A. Varallo; M. L. Young; K. R. Peterson

[57] ABSTRACT

The present disclosure describes a low insertion force connector for use with integrated circuit (IC) packages of the LSI/VLSI type. The connector is characterized by simplicity of design and economy of manufacture. The well known friction-type contact comprised of members which enclose and bear against the pin surface is replaced by a pin-receiving cup loosely fitted in a cavity in the connector body and supported by one extremity of a light spring member. The opposite extremity of the latter may include an integral tail section or a separate solder or wire wrap tail may be affixed thereto. The force required to seat the IC package in the connector is a function of the spring compressive forces and may be made quite low. Removal force for the package is virtually zero. Additionally, a ramp section in the connector is adapted to receive a wedge-like member which bears against the outer surface of the IC package and causes the gradual collapse of the contact springs as the package is seated.

9 Claims, 4 Drawing Figures

CONNECTOR FOR PIN TYPE INTEGRATED CIRCUIT PACKAGES

BACKGROUND OF THE INVENTION

The use of high density integrated circuit (IC) packages of the LSI/VLSI types comprised of approximately 100 to more than 300 interface (input/output) pins has become commonplace in the electronics field. Such IC packages are generally designed to be mounted in a connector or socket. The latter commonly have a plurality of electrical contacts which apply friction pressures to the respective pin surfaces as the latter are inserted therein. Because of the large number of pins involved and the last mentioned pressures, an insertion force of large magnitude applied orthogonally to the outer package surface is required to seat the package in the connector. The amount of insertion force required is such that the surface of the interconnection medium to which the connector contacts are electrically connected may be distorted or otherwise damaged. Moreover, the subsequent removal of the IC package from the connector cannot be readily accomplished without the aid of a special extraction tool. An additional problem stemming from the large number of IC interface pins is that perfect registration between the pin locations and the homologous pin-receiving openings of the connector contacts is required. Even slight deviations in such registration may result in damage to the pins during the insertion process.

In view of the aforementioned problems in present day connector design, it is apparent that a connector is needed which will provide low insertion and removal force conditions, while maintaining adequate electrical contact pressure during normal operation. Moreover, the requirement of perfect registration of the IC pins and the connector contacts should be eliminated.

The connector of the present invention provides a simple, cost-efficient solution to these problems.

SUMMARY OF THE INVENTION

In accordance with the present invention, there is provided a connector capable of receiving or releasing an integrated circuit package under low force conditions. While the connector finds particular application for LSI and VLSI packages having large numbers of input/output pins, the invention should not be considered so limited.

Basically, the connector comprises an open rectangular box-like body of electrically insulative material having a base and three upright sides. The fourth side is absent, thereby leaving one side open, in addition to the top of the connector body. The opposing sides of the body include respective ledges which originate respectively near the uppermost portions of the sides adjacent the open end of the connector body. The ledges then traverse the length of the sides, angled downward toward the base in ramp-like fashion, and terminating at the inner surface of the remaining side of the connector body.

The base includes a plurality of cavities homologously arranged with respect to the integrated circuit package pins for receiving the respective contacts. Apertures leading from the bottom of the cavities to the outer surface of the base are provided.

Each contact element is comprised of an assembly which includes a pin-receiving cup affixed to, or otherwise supported by, one extremity of a light spring, and a tail section either integral with, or attached to, the opposite extremity of the spring. The contact assembly is inserted into a cavity in the connector base, with the tail section protruding therefrom.

A planar cover of relatively thin cross-section and having a plurality of apertures coinciding generally with the respective central axes of the base cavities is affixed to the base to retain the contact elements.

In seating the IC package, the pins of the latter are placed within the cover apertures, in contact with the pin-receiving cups. A wedge-like member is then introduced into the connector body via its open side. The angled surface of the member contacts the aforementioned side ledges, while its opposite surface presses against the outer planar surface of the IC package. Movement of the wedge into the connector causes the IC pins to gradually compress the contact element springs. Finally, the wedge includes a transverse groove adapted to engage rod-like protuberances in the ledges when the former is fully inserted in the connector, thereby locking the IC package in place.

Other features and advantages of the present invention, including the provision of a metal shell or sleeve disposed in each base cavity and touching the contact spring, will become apparent in the detailed description of the invention which follows.

DESCRIPTION OF THE PREFERRED EMBODIMENT

Figure 1:
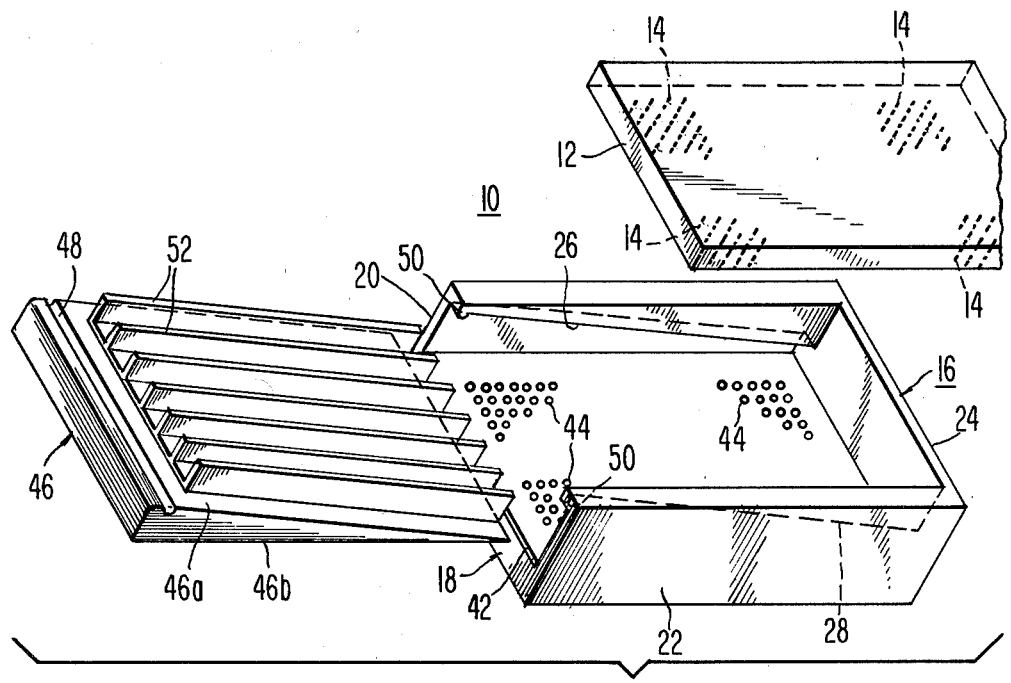
FIG. 1 is an exploded view illustrating the details of the connector body of the present invention, the IC package and the wedge-like member for seating the latter within the connector.
Figure 2:
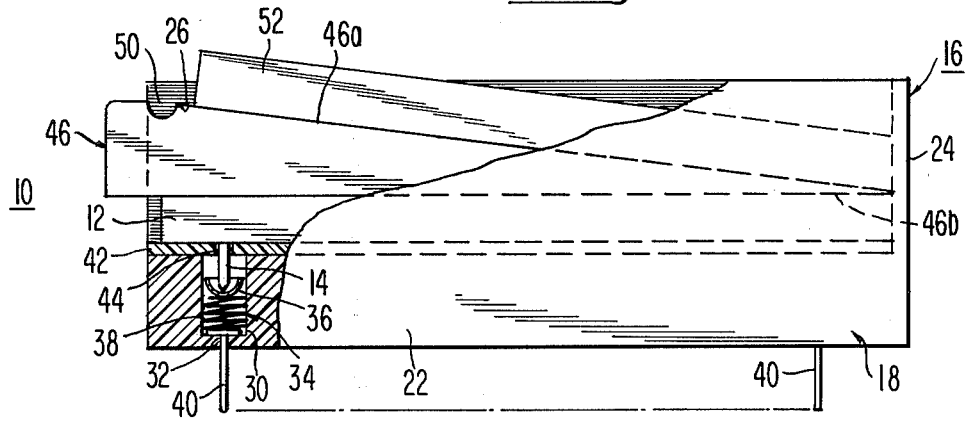
FIG. 2 is a side view of the assembled package, partially cut away to illustrate in particular, the contact elements.

In FIG. 1, there is illustrated in exploded fashion, the relationship between the connector 10 of the present invention, and an IC package 12 having a plurality of interface pins 14. FIG. 2 depicts the package 12 installed in connector 10. With reference to FIGS. 1 and 2, the connector 10 is comprised of a body 16 of electrically insulative material having a base 18 and three sides 20, 22 and 24. Sides 20 and 22 include respective ledges 26 and 28 which are angled downward in ramp fashion toward base 18 and terminate at the inner surface of side 24.

Base 18 includes a plurality of cylindrical cavities 30 homologously arranged with respect to the IC package pins 14. Apertures 32 leading from the bottom of cavities 30 to the outer surface of base 18 are provided.

Figure 3:
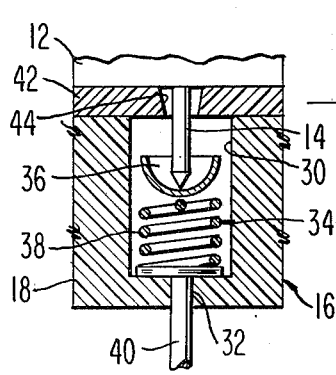
FIG. 3 is an enlarged view of a contact element within a connector base cavity.

As seen in FIGS. 2 and 3, the connector 10 includes a plurality of contacts 34 disposed respectively in the cavities 30. Each contact 34 is comprised of a pin-receiving cup 36 loosely fitted in the cavity 30 and attached to one extremity of a spring 38. A tail section 40 is attached to the opposite extremity of spring 38 and protrudes via aperture 32 beyond the outer surface of base 18. If desired the tail 40 may be an extended portion of the spring 38. The tail 40 is utilized for solder or wire wrapped electrical connections.

After all of the contacts 34 have been installed in the cavities 30, a cover 42 is placed thereover to retain them in place. Cover 42 contains a plurality of openings 44 having central axes which are coincident respectively with those of the cavities 30. Each opening 44 has a beveled lead-in surface to facilitate the entrance and guidance of an IC package pin 14 to the cup 36. The nature of the openings 44 and the large pin-receiving areas provided by cups 36 combine to minimize the registration requirements of the IC package pins 14 with the contacts 34.

The IC package 12 is seated in the connector 10 in the following manner. Initially the package 12 is placed upon the base cover 42 so that its pins 14 enter the corresponding openings 44 and contact the pin-receiving cups 36. A wedge-like member 46 in the form of an inclined plane is then introduced into the connector body 16 via the open side of the latter and moved in a direction parallel to the planar surface of cover 42. The planar oblique angular surface 46a of wedge 46 contacts the ledges 26 and 28 of sides 20 and 22, while horizontal surface 46b bears against the outer surface of the IC package 12. The IC package pins 14 gradually compress the contact springs 38 as the wedge 46 is inserted. The force required at any given time to seat the package is thereby minimized, compared to that which would be required if all the springs 38 were compressed simultaneously by a force applied orthogonally to the planar surface of package 12. Moreover, since the insertion force is a function of the spring compression characteristics, for example, those associated with beryllium copper coils, it may be made quite low, consistent with the force required to obtain good operational electrical conductivity between a pin 14 and a cup 36. In this regard, cup 36 may be formed of gold plated metal. This is in contrast with the high friction forces exerted on IC package pins by the contacts of many present day connectors. The wedge 46 includes a groove 48 in surface 46a which engages the rod-like protuberances 50 on ledges 26 and 28 when fully inserted in the connector body 16, thereby locking the IC package 12 in place.

To remove the package 12 from the connector 10, the wedge 46 is depressed slightly to disengage the protuberances 50 from the groove 48, and the wedge is withdrawn. The action of contact springs 38 on the IC package pins 14 permits the package to be removed without additional force.

As seen in FIGS. 1 and 2, the wedge 46 may include on its surface 46a, a plurality of longitudinally disposed, parallel spaced-apart ribs 52 to better dissipate the heat generated in the IC package 12.

Figure 4:
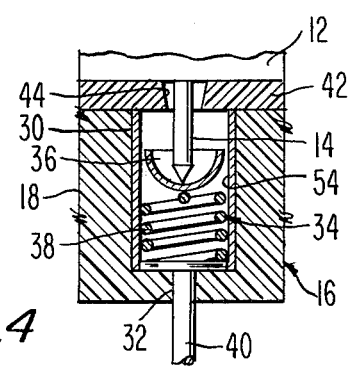
FIG. 4 illustrates the contact element of FIG. 3 disposed in an electrically conductive sleeve or shell placed within the connector base cavity.

In certain high speed circuit applications, it may be desirable to modify the cavities 30 in connector base 18 as shown in FIG. 4. As noted hereinbefore, the base 18 is formed of electrically insulative material. A metallic cylindrical sleeve 54 is inserted in each cavity 30 prior to the placement of the contact 34 therein. The diameter of the springs 38 is then chosen such that the outer surfaces of the spring coils lightly contact sleeve 54. This has the effect of electrically shorting the coils, thereby eliminating any inductive effects that might otherwise be present.

In conclusion, there has been disclosed a connector which is well suited for present day high density packaging applications. It should be noted that the details of conduction and the materials employed have been presented herein for purposes of example and that depending upon particular application, changes and modifications of the connector may be required. Such changes and modifications insofar as they are not departures from the true scope of the invention are intended to be covered by the claims which follow.

What is claimed is:

1. A low insertion force connector for receiving the interface pins of an integrated circuit package comprising:

a plurality of electrical contacts, each contact comprising a longitudinal assembly of a pin-receiving cup, a spring member and a tail section, said pin-receiving cup being supported by said spring member at one extremity of the latter, and said tail section being disposed at the opposite extremity of said spring member, a connector body including a base having an inner and an outer planar surface, said inner surface of said base having a plurality of cavities for receiving respectively said plurality of electrical contacts, said outer surface of said base having a plurality of apertures leading into said cavities, said apertures permitting said tail section of said electrical contacts to penetrate said base and to be accessible for electrical interconnections external to said connector, a cover disposed on said inner surface of said base for retaining said electrical contacts in said cavities, said cover having a plurality of openings homologously arranged with respect to said cavities for permitting said interface pins to engage said pin-receiving cups, and means for applying a force to the outer surface of said integrated circuit package subsequent to the registration of said interface pins in said openings of said cover for causing said pins to compress the spring members of said contact elements, thereby seating said integrated circuit package in said connector and insuring adequate electrical continuity therebetween.

2. A connector as defined in claim 1 further characterized in that said connector body is configured as a rectangular box-like structure open on top and at one end, said connector body having three upright sides projecting from said base, first and second opposing ones of said sides including respective ledges originating substantially at the outermost portion thereof adjacent the open end of said connector body, traversing the length of said last mentioned sides, angling toward said base and terminating at the inner surface of the third one of said sides.

3. A connector as defined in claim 2 wherein said means for applying a force to said integrated circuit package comprises a wedge-like member in the form of an inclined plane, said last mentioned member entering said connector body via said open end thereof and being inserted between said ledges and the outer surface of said integrated circuit package, movement of said wedge-like member toward said third of said sides of said connector body resulting in the gradual compression of said spring members by the force exerted on the associated pin-receiving cups by said interface pins.

4. A connector as defined in claim 3 wherein said wedge-like member includes a transverse groove in its planar oblique angular surface, said groove being situated in proximity to the extremity of said last mentioned member which lies opposite to its thin edge, said ledges in said connector body having respective rod-like protuberances in proximity to said open end thereof, said groove engaging said protuberances when said wedge-like member is fully inserted in said connector body and serving to lock said integrated circuit package in place.

5. A connector as defined in claim 4 wherein said connector body is formed of electrically insulative material, a plurality of electrically conductive sleeves disposed respectively in said plurality of cavities in said base, said spring members each having a plurality of coils, the outside diameter of said coils being chosen such that they lightly contact the inner surfaces of said sleeves.

6. A connector as defined in claim 4 wherein said wedge-like member further includes a plurality of longitudinally disposed, parallel spaced-apart ribs projecting from said oblique angular surface thereof and serving to dissipate the heat generated in said integrated circuit package.

7. A connector as defined in claim 6 further characterized in that said openings in said cover have beveled lead-in surfaces to facilitate and guide the entrance of said interface pins to said pin-receiving cups.

8. A connector as defined in claim 7 wherein said pin-receiving cup, spring member and tail section of the contact assembly are permanently affixed to one another to form a unitary structure.

9. A connector as defined in claim 8 wherein said pin-receiving cup is a hemispherical, gold-plated metal unit and said spring member is comprised of a plurality of coils of beryllium copper.

* * * * *